United States Patent [19]

Taura et al.

[11] Patent Number: 5,364,805
[45] Date of Patent: Nov. 15, 1994

[54] METHOD OF MANUFACTURING AN EEPROM HAVING AN ERASING GATE ELECTRODE

[75] Inventors: Tadayuki Taura, Kawasaki; Masamichi Asano, Tokyo; Kazunori Kanebako; Hiroshi Iwahashi, both of Yokohama, all of Japan

[73] Assignee: Kabushiki Kaisha Toshiba, Kawasaki, Japan

[21] Appl. No.: 726,881

[22] Filed: Jul. 8, 1991

Related U.S. Application Data

[62] Division of Ser. No. 461,537, Jan. 5, 1990, abandoned.

[30] Foreign Application Priority Data

Jan. 13, 1989 [JP] Japan ................................ 1-7433

[51] Int. Cl.⁵ .......................................... H01L 21/265
[52] U.S. Cl. ......................................... 437/43; 437/48; 437/49; 437/941
[58] Field of Search ................. 437/48, 43, 52, 912; 357/23.5; 365/185

[56] References Cited

U.S. PATENT DOCUMENTS

| | | | |
|---|---|---|---|
| 4,257,826 | 3/1981 | Matalone, Jr. | 437/48 |
| 4,258,466 | 3/1981 | Kuo et al. | 437/48 |
| 4,466,081 | 8/1984 | Masuoka | 357/23.5 |
| 4,851,364 | 7/1989 | Yatsuda et al. | 437/48 |
| 4,910,565 | 3/1990 | Masuoka | 357/23.5 |
| 4,924,437 | 5/1990 | Paterson et al. | 365/185 |
| 4,967,393 | 11/1990 | Yokoyama et al. | 365/185 |

FOREIGN PATENT DOCUMENTS

| | | | |
|---|---|---|---|
| 0054355A2 | 11/1981 | European Pat. Off. | 357/23.5 |
| 0253014 | 1/1988 | European Pat. Off. | 437/52 |
| 0282022A2 | 3/1988 | European Pat. Off. | 357/23.5 |

*Primary Examiner*—George Fourson
*Assistant Examiner*—H. Jey Tsai
*Attorney, Agent, or Firm*—Banner, Birch, McKie & Beckett

[57] ABSTRACT

A memory cell array is formed of a plurality of nonvolatile memory cell transistors arranged in a matrix form. The patterns of the control gate electrode and the source region of each memory cell transistor are formed in parallel and the pattern of the erasing gate electrode is formed to intersect the source region and control gate electrode patterns. A field oxide film is formed in an intersecting portion between the source region and the erasing gate electrode.

4 Claims, 10 Drawing Sheets

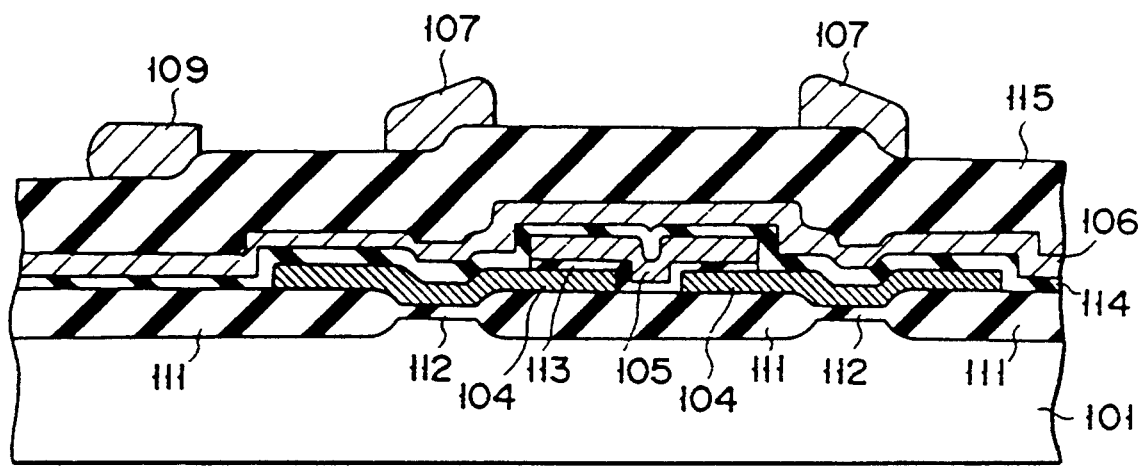
F I G. 2A

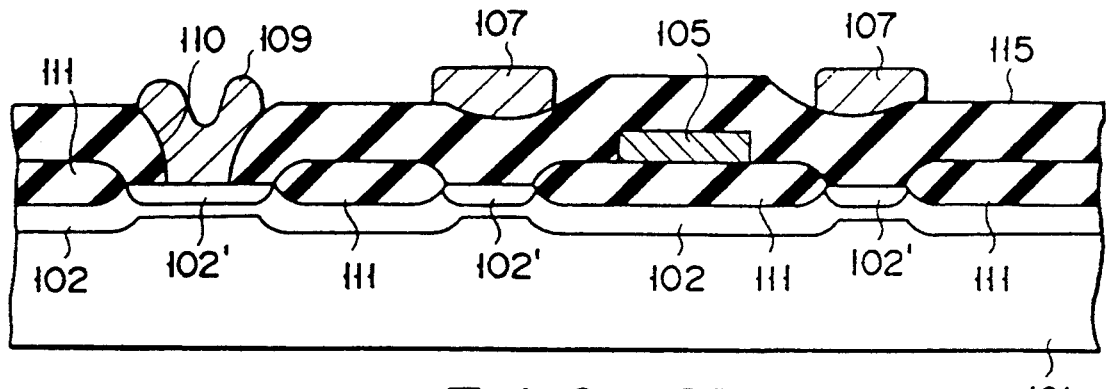
F I G. 2B
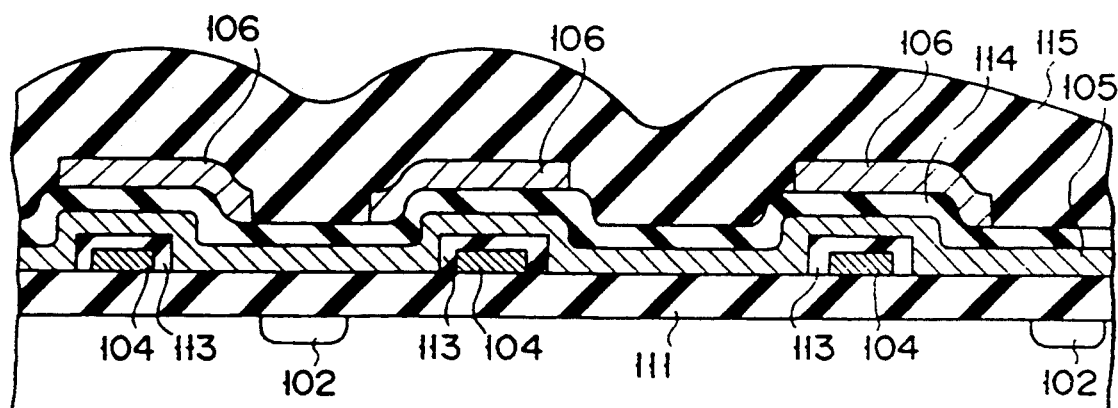
F I G. 2C
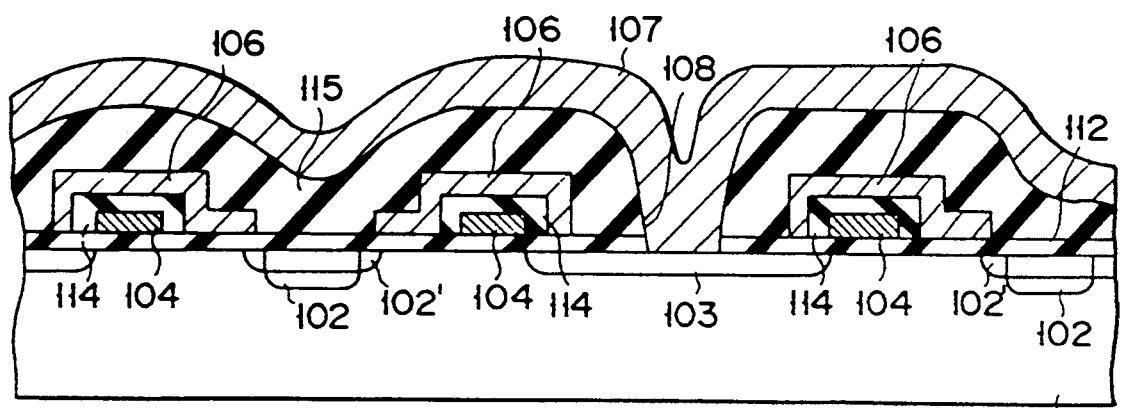
F I G. 2D

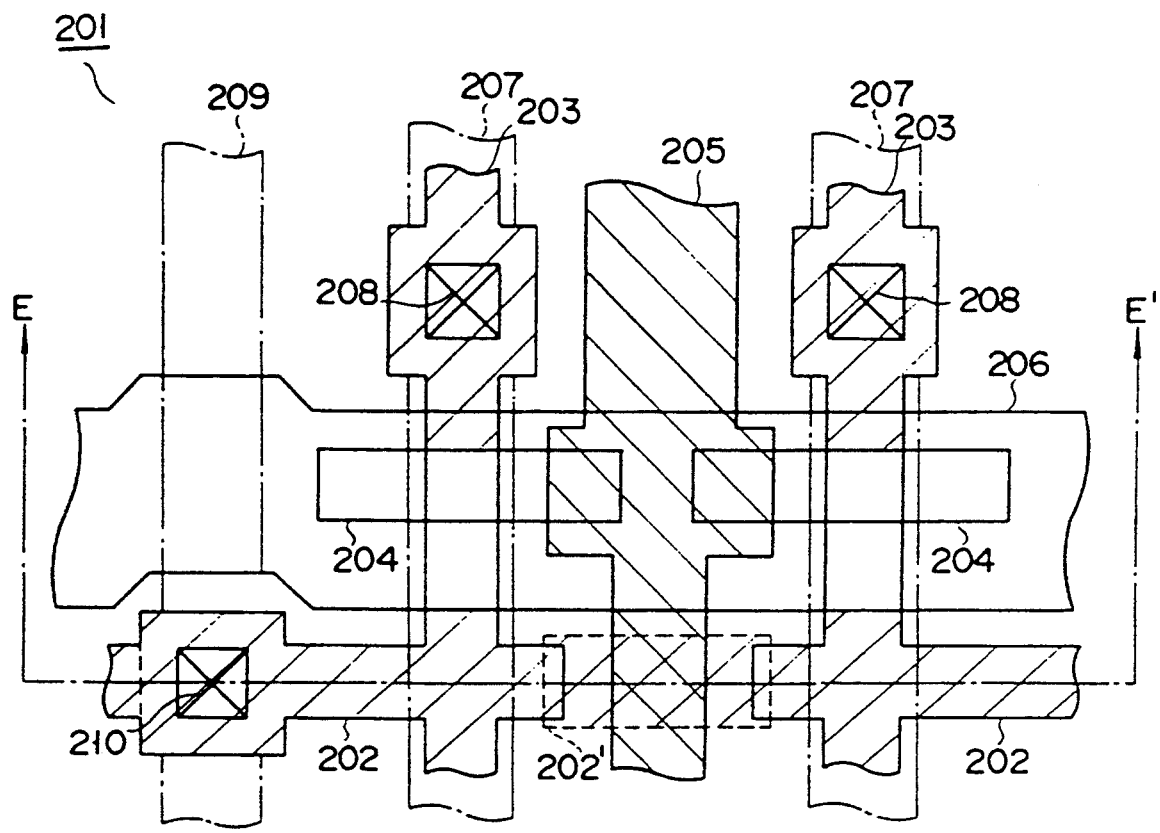
F I G. 6
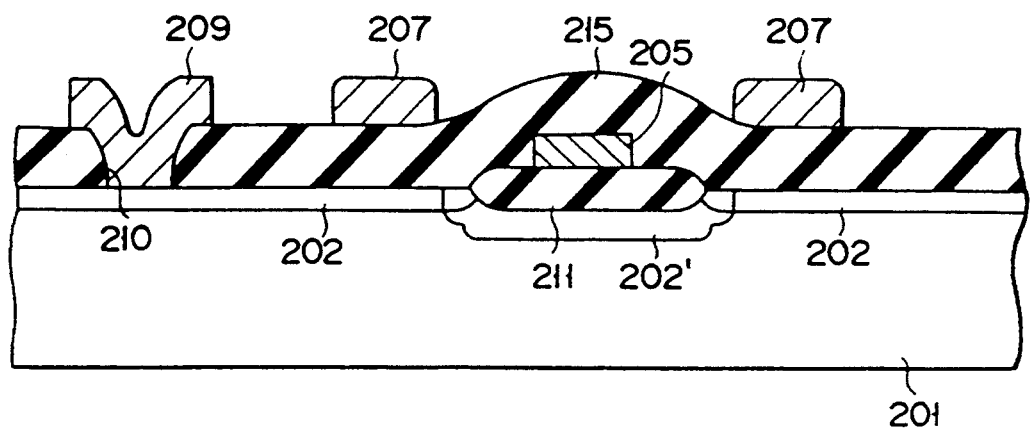
F I G. 7

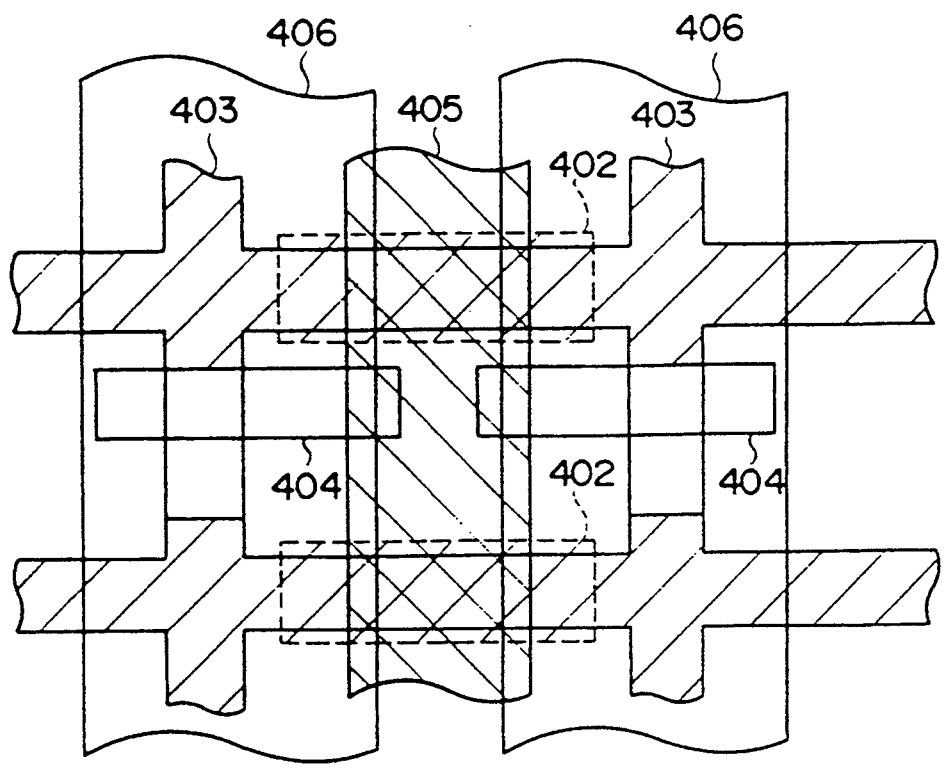
F I G. 10
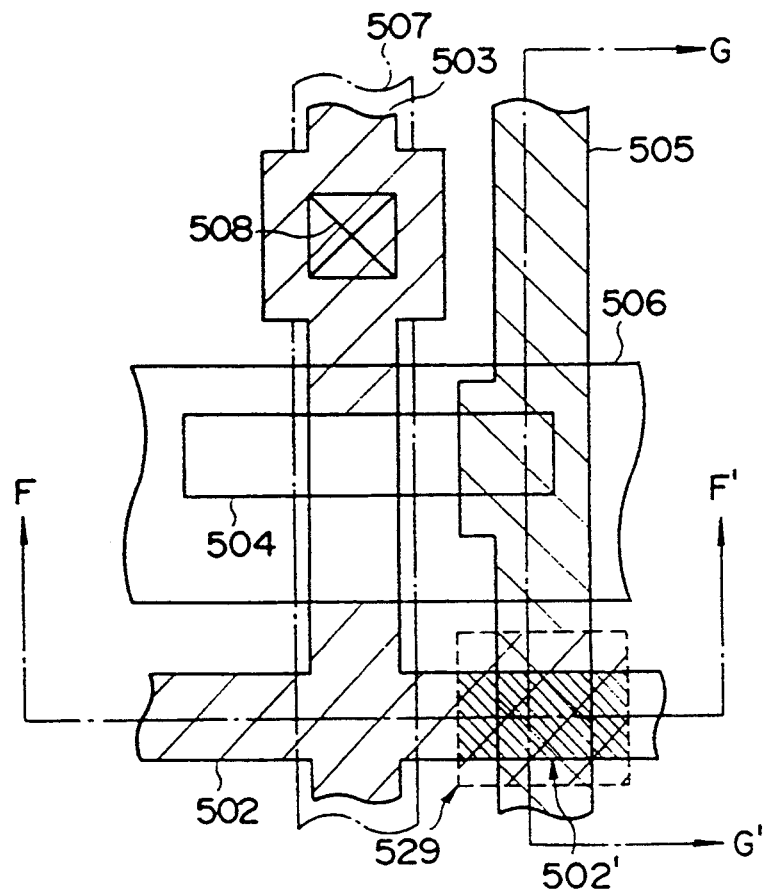
F I G. 11

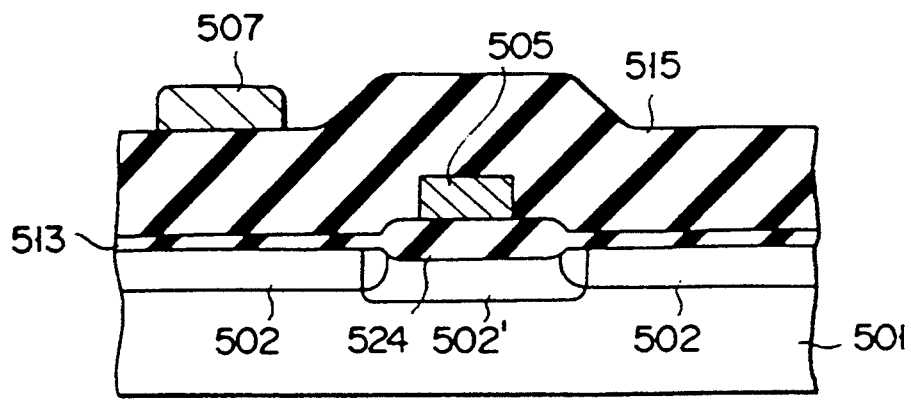
F I G. 12A
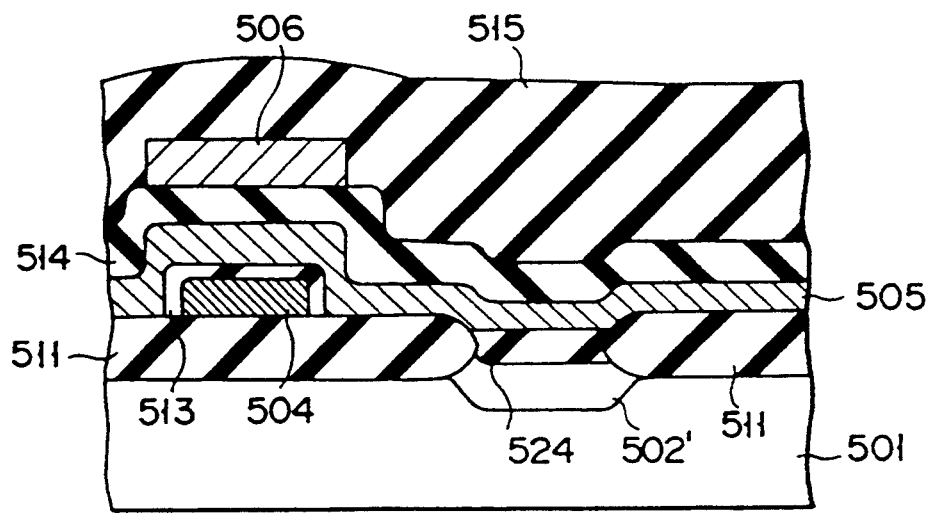
F I G. 12B

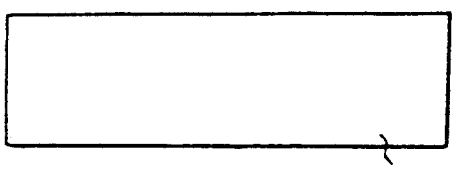
F I G. 13A
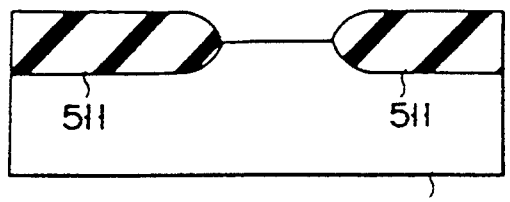
F I G. 14A
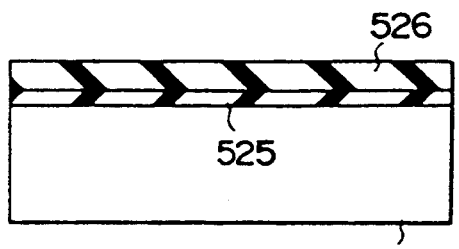
F I G. 13B
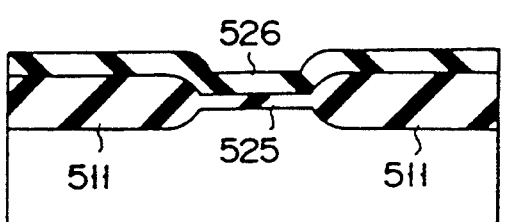
F I G. 14B
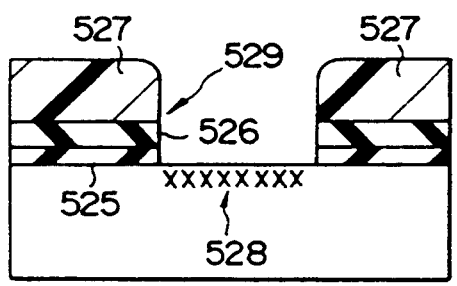
F I G. 13C
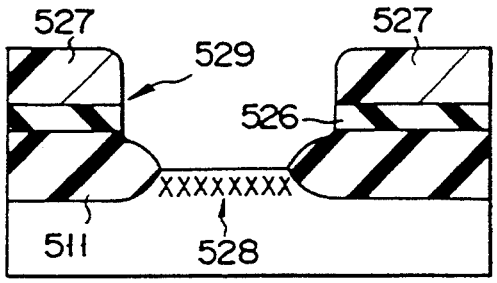
F I G. 14C
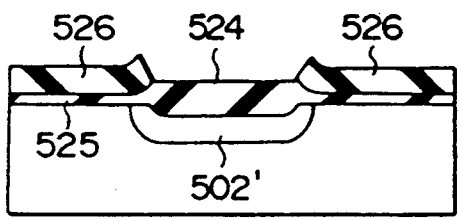
F I G. 13D
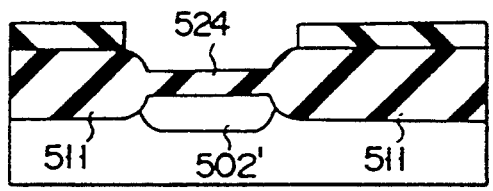
F I G. 14D
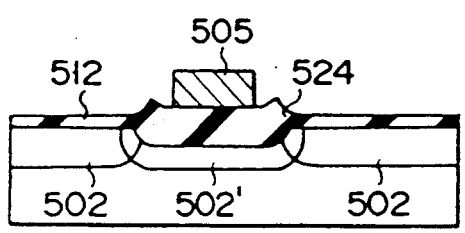
F I G. 13E
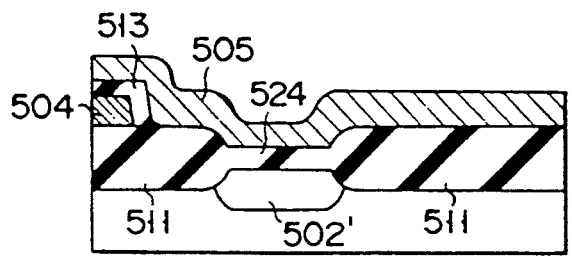
F I G. 14E

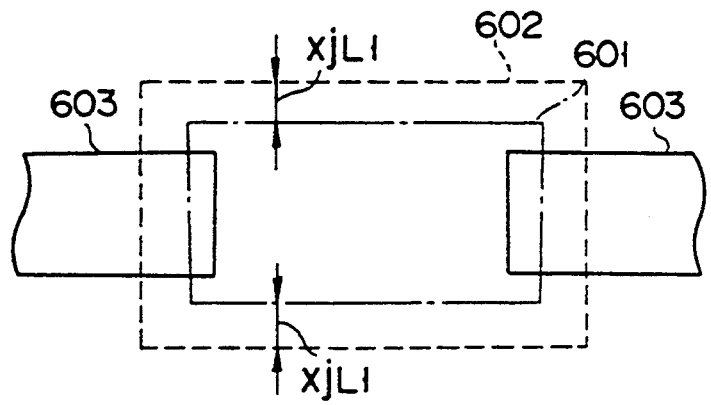
F I G. 15A
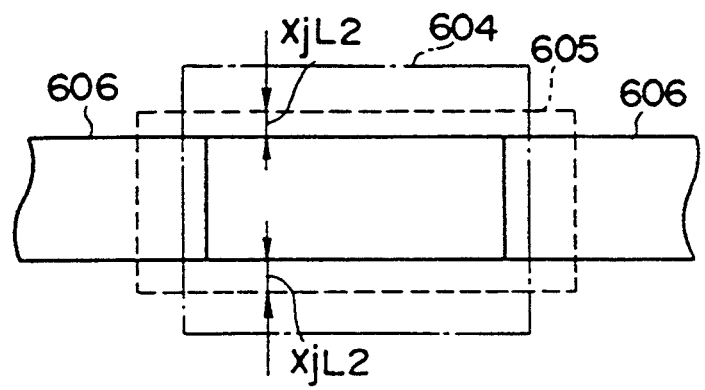
F I G. 15B

METHOD OF MANUFACTURING AN EEPROM HAVING AN ERASING GATE ELECTRODE This application is a division, of application Ser No. 07/461,537, filed Jan. 5, 1990 now abandoned.

BACKGROUND OF THE INVENTION

1. Field of the Invention

This invention relates to a nonvolatile semiconductor memory device, and more particularly to an EEPROM having control gate electrode and source region patterns formed in parallel with each other and erasing gate electrode patterns formed to intersect the control gate electrode and source region patterns and a method for manufacturing the same.

2. Description of the Related Art

An EEPROM is widely known as an electrically erasable and programmable nonvolatile semiconductor memory device. The EEPROM is generally constructed by a memory cell transistor having a three-layered gate structure including a floating gate electrode formed of a first polysilicon layer, an erasing gate electrode formed of a second polysilicon layer and a control gate electrode formed of a third polysilicon layer. In this type of memory device, the control gate electrode and source region patterns are alternately arranged in parallel with each other and the erasing gate electrode patterns are formed to extend in the channel length direction of the memory cell transistor or in a direction intersecting the control gate electrode and source region patterns in order to reduce the size of the memory cell transistor. The construction of the above EEPROM is described in U.S. Pat. No. 4,466,081, for example.

In the above EEPROM, the control gate electrode and the source region inevitably intersect the erasing gate electrode. In this case, a problem occurs in that part of the source region which intersects the erasing gate electrode. When memory data in a memory cell is erased, a voltage applied to the erasing gate electrode is raised so as to drive out electrons stored in the floating gate electrode to the erasing gate electrode by making use of the tunnel effect of a thin oxide film disposed between the floating gate electrode and the erasing gate electrode. For this reason, in the erasing operation, a high voltage is applied to the erasing gate electrode. The source region which intersects the erasing gate electrode is always set at a ground potential, or it is always applied with 0 V, for example. Therefore, if a voltage of 20 V is applied to the erasing gate electrode, for example, a voltage of as high as 20 V is applied between the erasing gate electrode and the source region at the intersecting portion thereof. In this case, if the oxide film disposed between the erasing gate electrode and the source region is thin (for example, with a thickness of approximately 300 Å), an electric field of as strong as approximately 6.7 MV/cm is applied to the oxide film. As a result, the oxide film may be easily broken down, degrading the reliability of the memory device.

In order to solve the problem caused by the high potential difference occurring in the above intersecting portion in the erasing operation, the oxide film disposed between the erasing gate electrode and the source region at the intersection portion thereof is generally made thick. When the thickness of the oxide film disposed between the erasing gate electrode and the source region is set to approximately 2000 Å, the electric field applied to the oxide film is reduced to approximately 1 MV/cm, preventing the oxide film from dielectric breakdown.

However, problems occur when a thick oxide film is selectively formed in each intersecting portion. In order to form the thick oxide film only in the intersecting portion, a thick oxide film is formed on the entire surface of the structure and then that portion of the thick oxide film which does not lie in the intersecting portion is selectively removed. In a case where the thick oxide film is formed by the CVD method, for example, the oxide film is formed thick on the semiconductor substrate but is formed thin on the field oxide layer since the growth speed of the oxide film is different on the semiconductor substrate and on the field oxide layer. When the thick oxide film which is not uniform in thickness is selectively removed by an etching process so as to be left behind only in the intersecting portion, that portion of the field oxide layer which lies under the thin oxide film is partly etched and the thickness thereof is reduced. If, in this way, the thickness of the field oxide layer acting as an element isolation region is reduced, leak may occur between elements, degrading the reliability of the memory cell. Further, since the field oxide film is originally formed thin in the bird's beak portion thereof, the substrate surface is exposed in the etching process and a concave or hollow-out portion is formed. Since the hollow-out portion is formed in the surface of the substrate, the width of the gate of each memory cell transistor, and also the widths of the gates of the other transistors incorporated in the EEPROM—all these gates to be formed later—increase, making it difficult to impart desired characteristics to these transistors.

SUMMARY OF THE INVENTION

An object of this invention is to provide a highly reliable nonvolatile semiconductor memory device.

Another object of this invention is to provide a nonvolatile semiconductor memory device in which the dielectric breakdown of an intersecting portion between the erasing gate electrode and the source region can be enhanced.

A still another object of this invention is to provide a nonvolatile semiconductor memory device in which fluctuation in the characteristic of the memory cell transistor and leak between elements caused by etching the field oxide layer can be suppressed.

The above objects may be attained by a nonvolatile semiconductor memory device comprising a plurality of memory cell transistors which each have a source region, drain region, floating gate electrode, erasing gate electrode and control gate electrode, the control gate electrode and source region patterns of the memory cell transistors being formed in parallel and the erasing gate electrode patterns being formed to intersect the control gate electrode and source region patterns; and field insulation films disposed at intersecting portions between the source region patterns and the erasing gate electrode patterns.

Further, the above objects may be attained by a method for manufacturing nonvolatile semiconductor memory devices according to this invention which comprises the steps of forming first impurity regions of a first conductivity type in the main surface area of a semiconductor substrate of a second conductivity type; forming a field insulation film on the semiconductor substrate and the first impurity region to attain element isolation; forming a first insulation film on the resultant structure; forming a first conductive layer on the first insulation film; patterning the first conductive layer to form floating gate electrodes; forming a second insulation film on the resultant structure; forming a second conductive layer on the second insulation film; patterning the second conductive layer to form erasing gate electrodes having patterns which intersect the patterns of the first impurity regions with the field insulation film disposed therebetween; forming a third insulation film on the resultant structure; forming a third conductive layer on the third insulation film; patterning the third conductive layer to form control gate electrodes; and forming second impurity regions of the first conductivity type in contact with the first impurity regions in the main surface area of the semiconductor substrate.

In the above nonvolatile semiconductor memory device, since a sufficiently thick oxide film is formed in the intersecting portion between the erasing gate electrode and the source region, the dielectric breakdown voltage at the intersecting portion can be enhanced, thus making it possible to provide a highly reliable nonvolatile semiconductor memory device.

According to the above manufacturing method, since the field oxide film is formed in the intersecting portion between the erasing gate electrode and the source region by selective oxidation, it is not necessary to form a thick oxide film and selectively etch the same so as to remove portions thereof other than the intersecting portion. Therefore, a method for manufacturing nonvolatile semiconductor memory devices can be provided in which fluctuation in the characteristic of the memory cell transistor due to the presence of the hollow-out portion which is formed in the surface area of the substrate by etching the bird's beak portion and leak between elements caused by reduction in the field oxide layer can be suppressed.

BRIEF DESCRIPTION OF THE DRAWINGS

FIG. 2A is a cross sectional view of the pattern taken along the line A—A' of FIG. 1;

FIG. 2B is a cross sectional view of the pattern taken along the line B—B' of FIG. 1;

FIG. 2C is a cross sectional view of the pattern taken along the line C—C' of FIG. 1;

FIG. 2D is a cross sectional view of the pattern taken along the line D—D'of FIG. 1;

FIG. 6 is a plan view showing the pattern construction of part of a memory cell array in a nonvolatile semiconductor memory device according to a second embodiment of this invention;

FIG. 7 is a cross sectional view of the pattern taken along the line E—E'of FIG. 6;

FIGS. 8 to 10 are plan views showing the pattern constructions of part of a memory cell array in each of nonvolatile semiconductor memory devices according to third to fifth embodiments of this invention;

FIG. 11 is a plan view showing the pattern construction of part of a memory cell array in a nonvolatile semiconductor memory device according to a sixth embodiment of this invention;

FIG. 12A is a cross sectional view of the pattern taken along the line F—F' of FIG. 11;

FIG. 12B is a cross sectional view of the pattern taken along the line G—G' of FIG. 11;

FIGS. 13A to 13E are cross sectional views of the pattern taken along the line F—F' of FIG. 11 in a sequence of the manufacturing steps;

FIGS. 14A to 14E are cross sectional views of the pattern taken along the line G—G' of FIG. 11 in a sequence of the manufacturing steps; and FIGS. 15A and 15B are plan views respectively showing patterns of the impurity regions in the substrate under the intersecting portions between the erasing gate electrodes and the source regions in the above embodiments.

DETAILED DESCRIPTION OF THE PREFERRED EMBODIMENTS

Figure 1:
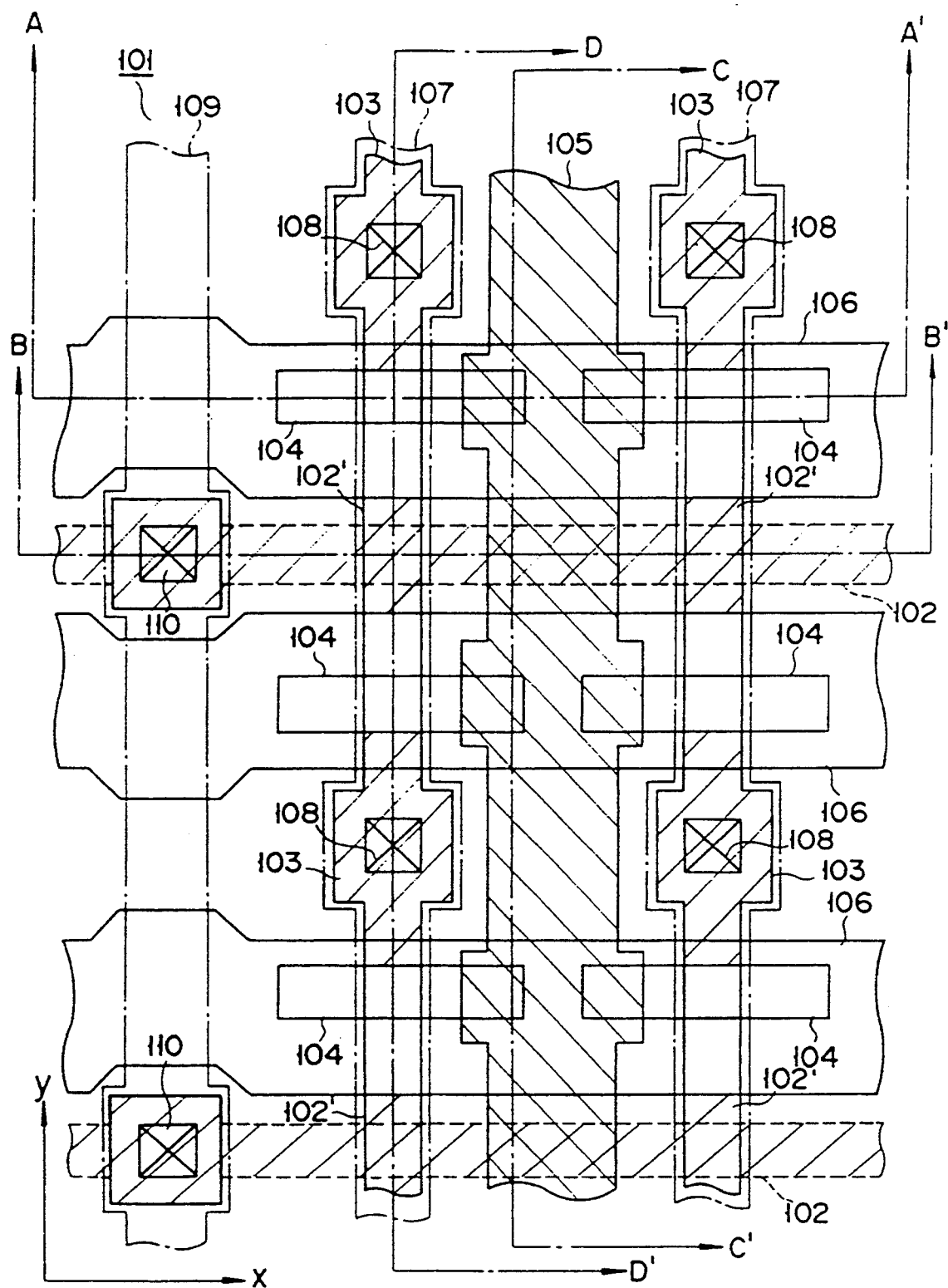
FIG. 1 is a plan view showing the pattern construction of part of a memory cell array in a nonvolatile semiconductor memory device according to a first embodiment of this invention.

FIG. 1 is a plan view showing the pattern construction of part of a memory cell array in a nonvolatile semiconductor memory device according to a first embodiment of this invention. FIGS. 2A to 2D are cross sectional views of the pattern taken along the lines A—A', B—B', C—C' and D—D' of FIG. 1, respectively.

N+-type source regions 102 and n+-type impurity regions 102' are formed in the main surface area of a semiconductor substrate 101 and alternately arranged to extend in an x direction or in the row direction of the memory cell array. Control gate electrodes 106 are formed on both sides of each of the regions 102 and 102' to extend in parallel with the patterns of the regions 102 and 102'. Erasing gate electrodes 105 are formed to extend in a column direction (in a y direction) intersecting the patterns of the regions 102 and 102' and the control gate electrodes 106. Data lines 107 are formed on both sides of the erasing gate electrode 105 to extend in parallel with the pattern of the erasing gate electrode 105. n+-type drain regions 103 are formed in that part of the main surface area of the semiconductor substrate 101 which lies below the data lines 107 and on the opposite side of the source regions 102 with respect to the control gate electrodes 106. Contact holes 108 are formed in an insulation film (not shown) which is formed on the drain regions 103 and the drain regions 103 are connected to the data lines 107 via the contact holes 108. Floating gate electrodes 104 are formed below the control gate electrodes 106 which lie between the source regions 102 and the drain regions 103. The floating gate electrodes 104 partly overlap with the erasing gate electrodes 105 with a thin oxide film (not shown) disposed therebetween. A ground line 109 extends in the y direction between every two groups of data lines, each group consisting of the same number of data lines. Contact holes 110 are formed in an insulation film (not shown) at the intersecting portions between the pattern of the ground line 109 and the patterns of the impurity regions 102' and the ground line 109 is connected to the impurity regions 102' via the contact holes 110.

Next, the cross section of the pattern shown in FIG. 1 is explained with reference to FIGS. 2A to 2D.

The cross section of the pattern taken along the line A—A' of FIG. 1 is formed as shown in FIG. 2A. A field oxide film 111 acting as a element isolation region is selectively formed on the main surface of the semiconductor substrate 101. First gate oxide films 112 are formed on those portions of the semiconductor substrate 101 which correspond to the element regions isolated by the field oxide film 111. The floating gate electrodes 104 formed of a first-layered polysilicon layer are formed on the first gate oxide film 112 and part of the field oxide film 111. A second gate insulation film 113 acting as a tunnel insulation film in the erasing mode is formed on the floating gate electrodes 104. The erasing gate electrode 105 formed of a second-layered polysilicon layer is formed on the second gate insulation film 113 to cover opposite portions of the adjacent floating gate electrodes 104. An insulation film 114, for example a three-layered structure of oxide film-nitride film-oxide film is formed on the resultant structure. The control gate electrode 106 formed of a third-layered polysilicon layer is formed on the insulation film 114 to extend in the x direction as shown in FIG. 1. A CVD oxide film 115 is formed as an interlayer insulation film on the resultant structure and the data lines 107 and the ground line 109 formed of aluminum are formed on the CVD oxide film 115 to extend in the y direction.

The cross section of the pattern taken along the line B—B' of FIG. 1 is formed as shown in FIG. 2B. The source regions 102 are formed in the main surface area of the semiconductor substrate 101. The field oxide film 111 is selectively formed on the main surface of the substrate 101. The n+-type impurity regions 102' are formed in those surface areas (in the source regions 102) of the semiconductor substrate 101 which are defined by the field oxide film 111. The impurity regions 102' are used as source regions. The erasing gate electrodes 105 are formed on the field oxide film 111. In this way, the field oxide film 111 is disposed in the intersecting portions between the erasing gate electrodes 105 and the source regions 102. The interlayer insulation film (CVD oxide film) 115 is formed on the resultant structure. The contact holes 110 are formed in the interlayer insulation film 115 at the intersecting portions between the source regions 102 and the ground line 109. The impurity regions 102' are connected to the ground line 109 via the contact holes 110.

The cross section of the pattern taken along the line C—C' of FIG. 1 is formed as shown in FIG. 2C. The n+-type source regions 102 are formed at a regular interval in the main surface area of the semiconductor substrate 101 and the field oxide film 111 is formed on the substrate 101. The floating gate electrodes 104 are formed on both sides of each of the source regions 102 on the field oxide film 111. The second gate oxide film 113 acting as a tunnel insulation film in the erasing mode is formed on the surface of the floating gate electrode 104. The erasing gate electrodes 105 are formed on the field oxide film 111 and the second gate oxide film 113. The insulation film 114 of the laminated structure is formed on the erasing gate electrodes 105 and the control gate electrodes 106 are formed over those portions of the insulation film 114 which lie over the floating gate electrodes 114. The interlayer insulation film 115 is formed on the resultant structure. As is clearly seen from FIG. 2C, the field oxide film 111 is .disposed in the intersecting portions between the erasing gate electrodes 105 and the source regions 102.

Further, the cross section of the pattern taken along the line D—D' of FIG. 1 is formed as shown in FIG. 2D. The source regions 102 and the drain regions 103 are formed at a regular interval in the main surface area of the semiconductor substrate 101. Each of the drain regions 103 is commonly used for the adjacent memory cell transistors. The n+-type impurity regions 102' are formed to overlap with the respective source regions 102. The n+-type impurity regions 102' are used as the source regions as described before. The first gate oxide film 112 is formed on the substrate 101 and the floating gate electrodes 104 are formed on those portions of the oxide film 112 which lie between the source regions 102 and the drain regions 103. The insulation film 114 of the laminated structure is formed on the surface of the floating gate electrodes 104. The control gate electrodes 106 are formed on those portions of the insulation film 114 and the first gate oxide film 112 which lie between the source regions 102 and the drain regions 103. The interlayer insulation film 115 is formed on the resultant structure and contact holes 108 are formed in the interlayer insulation film 115 on the drain regions 103. The data lines 107 are formed on the interlayer insulation film 115 and are connected to the drain regions 103 via the contact holes 108.

According to the nonvolatile semiconductor memory device having the memory cell transistors of the above construction, the field oxide film 111 is disposed in the intersecting portions between the erasing gate electrodes 105 and the source regions 102. Therefore, no dielectric breakdown will occur in the oxide film even if a high potential difference is applied between the erasing gate electrode and the source region in the erasing mode.

There will now be described a method for manufacturing the memory cell transistors shown in FIGS. 1 and 2A to 2D with reference to FIGS. 3A to 3E, 4A to 4D and 5A to 5E.

FIGS. 3A to 3E, 4A to 4D and 5A to 5E are cross sectional views of the pattern taken along the lines A—A', B—B'and C—C' of FIG. 1 which are shown in a sequence of the manufacturing steps.

Figure 3A:
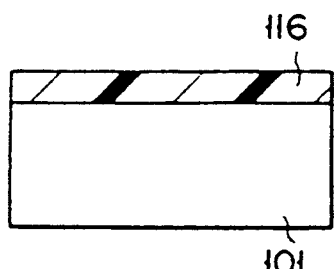
FIGS. 3A to 3E are cross sectional views of the pattern taken along the line A—A' of FIG. 1 in a sequence of the manufacturing steps.
Figure 4A:
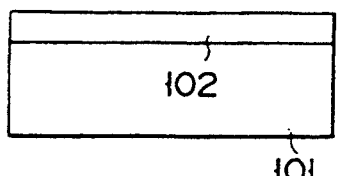
FIGS. 4A to 4D are cross sectional views of the pattern taken along the line B—B' of FIG. 1 in a sequence of the manufacturing steps.
Figure 5A:
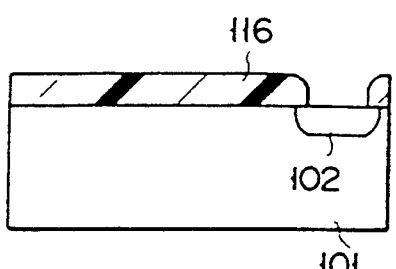
FIGS. 5A to 5E are cross sectional views of the pattern taken along the line C—C' of FIG. 1 in a sequence of the manufacturing steps.

As shown in FIGS. 3A, 4A and 5A, photoresist 116 is coated on the main surface of the semiconductor substrate 101 of p-type, for example, and then portions of the photoresist 116 which lie on source region forming areas are selectively removed by the photolithographic method. Next, n-type impurity is ion-implanted with the patterned photoresist 116 used as a mask to form the n+-type source regions 102.

Figure 3B:
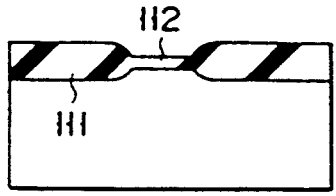
Figure 4B:
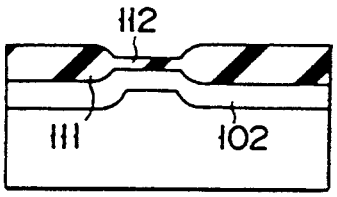
Figure 5B:
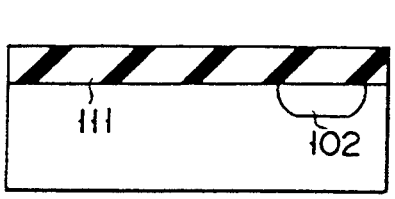

Then, the photoresist 116 is removed and the field oxide film 111 is formed to a thickness of 8000 Å as an element isolation region by selective oxidation by using the LOCOS method. At this time, the source regions 102 formed by ion-implantation in the preceding step are buried under the field oxide film 111. Next, the first gate oxide film 112 is formed to a thickness of 300 Å on that portion of the substrate 101 which is defined as the element region by the field oxide film 111 by use of the thermal oxidation method, for example. As a result, the semiconductor structure as shown in FIGS. 3B, 4B and 5B can be obtained.

Figure 3C:
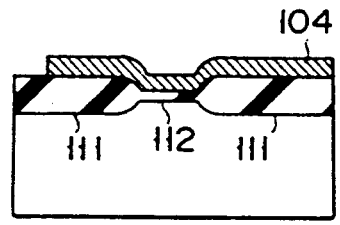
Figure 5C:
Figure 5C:
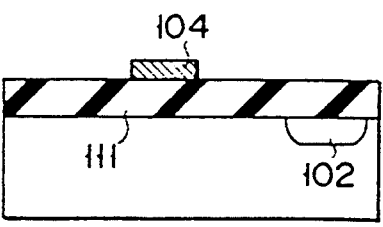

Next, as shown in FIGS. 3C and 5C, a first polysilicon layer is formed on the resultant structure by the CVD method, for example. Photoresist (not shown) is coated on the polysilicon layer and is patterned by the photolithographic method. At this time, the photoresist except those portions thereof corresponding to formation area of the floating gate electrode 104 is selectively removed. After this, the polysilicon layer is patterned with the remaining photoresist pattern used as a mask to form the floating gate electrode 104.

Figure 3D:
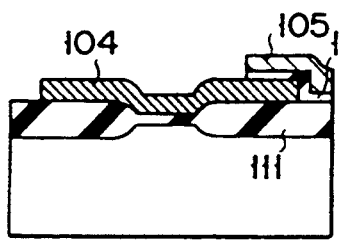
Figure 4C:
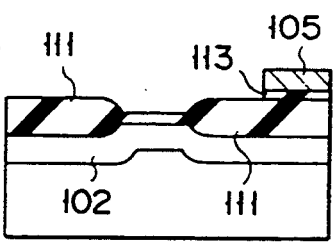
Figure 5D:
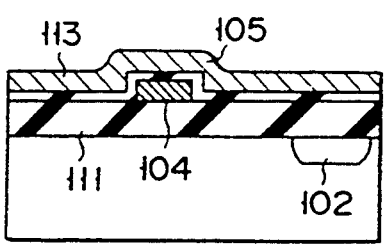
Figure 3E:
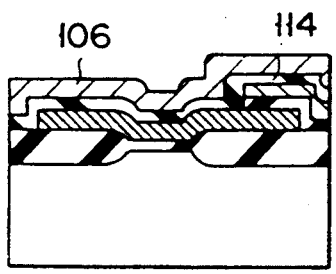
Figure 4D:
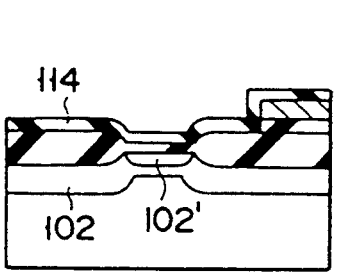
Figure 5E:
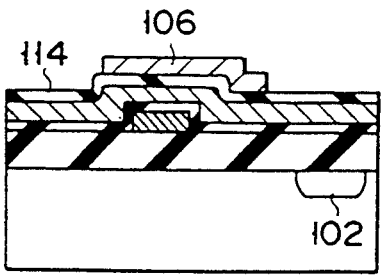

Next, as shown in FIGS. 3D, 4C and 5D, the thermal oxidation process is effected to form the second gate oxide film 113 on the exposed surface of the floating gate electrode 104. The second gate oxide film 113 is used as a tunnel oxide film which has a tunnel effect in the erasing mode and is disposed between the floating gate electrode 104 and erasing gate electrode 105 to be formed in the following step. The film thickness of the oxide film 113 is set according to a voltage applied to the erasing gate electrode 105. Next, a second-layered polysilicon layer is formed on the resultant structure by the CVD method. The polysilicon layer is patterned by the photolithographic method to form the erasing gate electrode 105. At this time, as shown in FIGS. 4C and 5D, the field oxide film 111 having a thickness of 8000 Å is formed in the intersecting portion between the erasing gate electrode 105 and the source region 102. Therefore, in the operation of erasing memory data, the dielectric breakdown will not occur in the oxide film even if a high potential difference is applied between the erasing gate electrode 105 and the source region 102.

After this, photoresist (not shown) is coated on the resultant semiconductor structure and those portions of the photoresist which lie on the formation area for the drain region 103 (which is not shown in FIGS. 3E, 4D and 5E but shown in FIG. 1) is selectively removed by the photolithographic method. Then, n-type impurity is ion-implanted with the remaining photoresist used as a mask and a heat treatment is effected to diffuse the ion-implanted impurity so as to form the drain region 103. Next, an oxide film is formed in the resultant structure, a nitride film is formed on the oxide film and then another oxide film is formed on the nitride film to form the insulation film 114 of the three-layered structure. After this, a third-layered polysilicon layer is formed on the insulation film 114 by the CVD method, for example, and then patterned by use of the photolithographic method to form the control gate electrode 106. Next, n-type impurity is ion-implanted with the control gate electrode used as a mask and is subjected to the thermal diffusion process to form the n+-type impurity region 102'.

After this, the oxide film 115 used as an interlayer insulation film is formed on the resultant structure by the CVD method, for example, and contact holes 108 and 110 (not shown) are formed in those portions of the oxide film 105 which lie on the impurity regions 102' and the drain regions 103. Then, an aluminum layer is formed on the oxide film 115 and patterned to form wiring layers such as the data lines 107 and the ground line 109.

The step of selectively forming the drain regions 103 is effected to form the drain regions 103 in a self-alignment manner by using the first-layered polysilicon layer which acts as the floating gate electrode 104 as a mask. The above step can be omitted without modifying the technical scope of this invention.

With the above manufacturing method, impurity are ion-implanted into the semiconductor substrate 101 to form the source regions 102 before the field oxide film 111 is formed so that the source regions 102 can be formed in the substrate 101 under the thick field oxide film 111. Therefore, the field oxide film 111 is disposed in the intersecting portions between the source regions 102 and the erasing gate electrodes 105. Since the field oxide film 111 is formed with a sufficiently large film thickness, the dielectric breakdown will not occur even if a high potential difference is applied between the source regions 102 and the erasing gate electrodes 105 in the memory data erasing mode. Further, it is possible to prevent the occurrence of the conventional problem of etch-back of the field oxide film which occurs when a thick oxide film is formed between the source regions and the erasing gate electrodes and then patterned to be left behind in the intersecting portions therebetween. As a result, decrease in the threshold voltage of the parasitic field transistor and the occurrence of leak between elements can be prevented. Therefore, it becomes possible to precisely manufacture memory devices to meet the initial design. Further, since the field oxide film 111 is used as the insulation film in the intersecting portion and it is not necessary to form an extremely thick oxide film, the photolithographic step can be omitted. As a result, the manufacturing yield can be enhanced and the manufacturing cost can be lowered.

FIG. 6 is a pattern plan view of part of a memory cell array in a nonvolatile semiconductor memory device according to a second embodiment of this invention and FIG. 7 is a cross sectional view of the pattern taken along the line E—E' of FIG. 6.

n+-type source regions 202 and n+-type impurity regions 202' are alternately formed in the main surface area of a semiconductor substrate 201 to extend in a row direction of the memory cell array with the end portions thereof overlapped. As will be described later, the regions 202' are formed by ion-implanting n-type impurity into the substrate 201 before formation of a field oxide film 211. The source regions 202 are formed by ion-implanting n-type impurity into the main surface area of the substrate 201 after the field oxide film 211 is formed on the main surface of the substrate 201. n+-type drain regions 203 are formed separately from the source regions 202 in the main surface area of the substrate 201. In this embodiment, the drain regions 203 and the source regions 202 are formed in the same step. Floating gate electrodes 204 formed of a first polysilicon layer are formed over those portions which lie between the source regions 202 and the drain regions 203 with a first gate oxide film (not shown) disposed therebetween. Erasing gate electrodes 205 formed of a second polysilicon layer are formed over the floating gate electrodes 204 with an oxide film (not shown) disposed therebetween. The erasing gate electrodes 205 are formed in a column direction of the memory cell array or in a direction intersecting the patterns of the source regions 202 and the impurity regions 202'. Control gate electrodes 206 formed of a third-layered polysilicon layer are formed over the erasing gate electrodes 205 in the row direction with an oxide film (not shown) or an insulation film of the laminated structure of oxide film-nitride film-oxide film disposed therebetween. Data lines 207 and a ground line 209 of aluminum, for example, are formed on the resultant structure with an interlayer insulation film. The data lines 207 are formed on both sides of each of the erasing gate electrodes 205 to extend in the column direction and are connected to the drain regions 203 via contact holes 208. The data lines 207 are connected to sense amplifiers (not shown). The ground line 209 is formed on the end portion of the memory cell array pattern to extend in the column direction and is connected to the source regions 202 via a contact hole 210. The ground line 209 is connected to a ground terminal.

As shown in FIG. 7, the n+-type source regions 202 are formed separately from one another in the main surface area of the semiconductor substrate 201. The n+-type impurity regions 202' are formed in those portions of the main surface area of the semiconductor substrate 201 which lie between the source regions 202. The field oxide film 211 is formed on the impurity regions 202' and the erasing gate electrodes 205 are formed on the field oxide film 211. In this way, the field oxide film 211 is disposed in the intersecting portions between the erasing gate electrodes 205 and the source regions 202. The interlayer insulation film 215 is formed on the resultant structure. The data lines 207 are formed on those portions of the interlayer insulation film 215 which lie on both sides of each of the erasing gate electrodes 205 and the ground line 209 is formed on that portion of the interlayer insulation film 215 which lies on the end portion of the memory cell array pattern. The contact hole 210 is formed in that portion of the interlayer insulation film 215 which lies on part of the source regions 202. The source regions 202 are connected to the ground line 209 via the contact hole 210.

Next, a method for manufacturing the memory cell array shown in FIGS. 6 and 7 is schematically explained. First, n-type impurity is selectively ion-implanted only into those portions of the substrate 201 which lie at the intersecting portions in order to form the impurity regions 202'. Then, the field oxide film 211 is formed on an area including the regions 202' of the substrate 201 by the selective oxidation method such as the LOCOS method. After this, the first gate oxide film (not shown) is formed on the exposed surface of the substrate 201 and the first-layered polysilicon layer is formed on the first gate oxide film. The polysilicon layer is patterned to form the floating gate electrodes 204. Next, a second oxide film (not shown) with a small film thickness is formed and the second-layered polysilicon layer is formed on the second gate oxide film. The second-layered polysilicon layer is patterned to form the erasing gate electrodes 205. In this way, the field oxide film 211 is disposed in the intersecting portions between the erasing gate electrodes 205 and the source regions 202. Next, the insulation film (not shown) having the laminated structure of oxide film-nitride film-oxide film is formed on the resultant structure. After this, the third-layered polysilicon layer is formed on the insulation film and patterned to form the control gate electrodes 206. Then, n-type impurity is ion-implanted and diffused by the heat treatment to form the source regions 202 and drain regions 203. Next, the interlayer insulation film 215 is formed on the resultant structure by use of the CVD method, for example, and the contact holes 208 and 210 are formed on those portions of the interlayer insulation film 215 which lie on the portions of the drain regions 203 and the source regions 202. An aluminum layer is formed on the interlayer insulation film 215 by the sputtering method, for example, and patterned to form the data lines 207 and the ground line 209. The data lines 207 are connected to the drain regions 203 via the contact holes 208 and the ground line 209 is connected to the source regions 202 via the contact hole 210.

According to the above manufacturing method, the following effects can be attained. That is, in the first embodiment, the source regions 102 are formed before the field oxide film 111 is formed so that the source regions can be formed under the field oxide film 111. In contrast, in the second embodiment, the field oxide film 211 is formed after the regions 202' are formed in the intersecting portions between the source regions 202 and the erasing gate electrodes 205, and then the source regions 202 are formed. Therefore, the source regions 202 will not be influenced by the heat treatment effected in the step of forming the field oxide film 211. As a result, even if the impurity regions 202' which are formed under the field oxide film 211 are widened by the influence of heat, the channel length of the memory cell transistor will not vary and can be precisely set to meet the designed value.

This invention is not limited to the patterns described in the above two embodiments. In the above embodiments, the source regions are commonly used by the memory cell transistors on the same row in the memory cell array and the drain regions are formed for the respective memory cell transistors. However, the pattern construction can be formed in which both the source and drain regions can be commonly used for the memory cell transistors on the same row. With such a pattern construction, the number of contact holes for electrically connecting the drain regions to the external portions can be reduced and thus the whole size of the memory device can be reduced.

Figure 8:
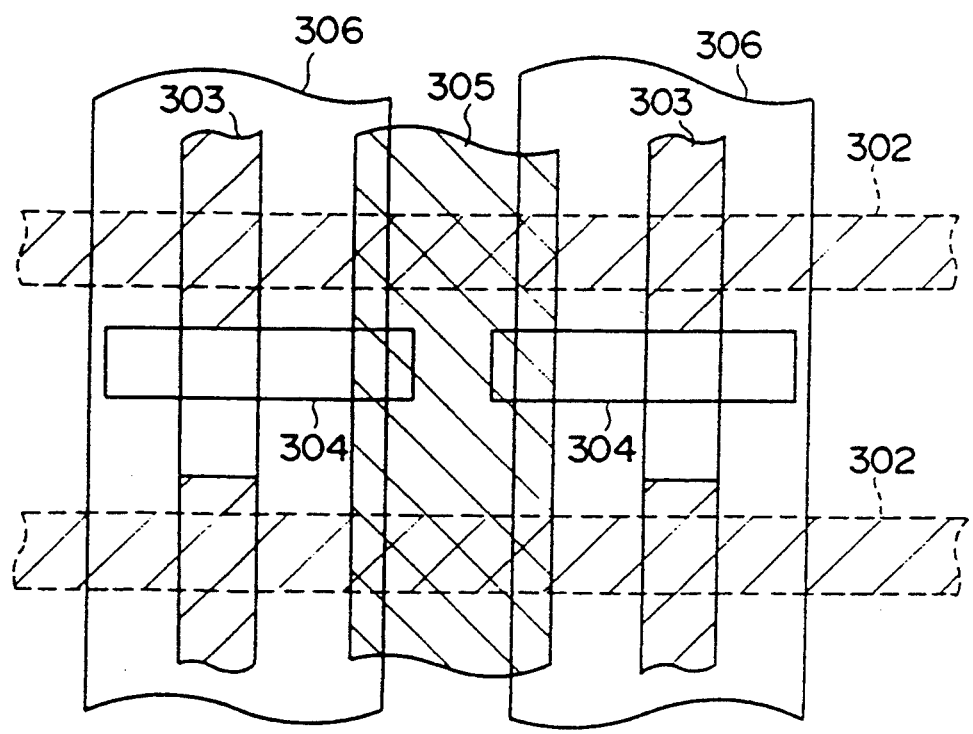

FIG. 8 is a plan view showing the pattern construction of part of a memory cell array in a nonvolatile semiconductor memory device according to a third embodiment of this invention and in this pattern construction, the source and drain regions can be commonly used for the memory cell transistors on the same row.

First source-drain common regions 302 of n+-type are formed at a regular interval in a row direction of the memory cell array in the main surface area of a p-type semiconductor substrate 301, for example. The common regions 302 are formed by ion-implanting n-type impurity and thermally diffusing the implanted impurity before the field oxide film is formed. Second source-drain common regions 303 of n+-type are formed in the channel width direction (in the column direction) of the memory cell transistor in the main surface area of the semiconductor substrate 301 to intersect the first source-drain common regions 302. The second source-drain common regions 303 are formed by ion-implanting n-type impurity and thermally diffusing the implanted impurity after the field oxide film is formed. Floating gate electrodes 304 formed of a first-layered polysilicon layer are formed over the semiconductor substrate 301 with a first gate oxide film (not shown) disposed therebetween. Erasing gate electrodes 305 are formed over the resultant structure in a column direction of the memory cell array with a thin oxide film (not shown) or a second gate insulation film disposed therebetween. The end portions of the floating gate electrodes 304 are formed to overlap with the erasing gate electrodes 305 with the second gate insulation film disposed therebetween. Control gate electrodes 306 formed of a third-layered polysilicon layer are formed over the resultant structure with an insulation film (not shown) having a laminated structure of oxide film-nitride film-oxide film.

As described above, the field oxide film having a sufficiently large film thickness is formed in the intersecting portions between the erasing gate electrodes 305 and the source-drain common regions 302. Therefore, the oxide film will not be subject to the dielectric breakdown even when a potential difference is applied between the erasing gate electrodes 305 and the first source-drain common regions 302.

The nonvolatile semiconductor memory device shown in FIG. 8 can be manufactured in substantially the same manufacturing process as in the first embodiment. The manufacturing process of this embodiment is similar to that of the first embodiment except that the step of ion-implanting impurity for forming the second source-drain common regions 303 is effected after the first-layered polysilicon layer is patterned. That is, the first source-drain common regions 302 are formed before the field oxide film is formed. After this, the field oxide film is formed and therefore the source-drain common regions 302 are formed under the field oxide film. In this way, the field oxide film having a sufficiently large film thickness can be formed in the intersecting portions between the erasing gate electrodes 305 and the source-drain common regions 302.

Figure 9:
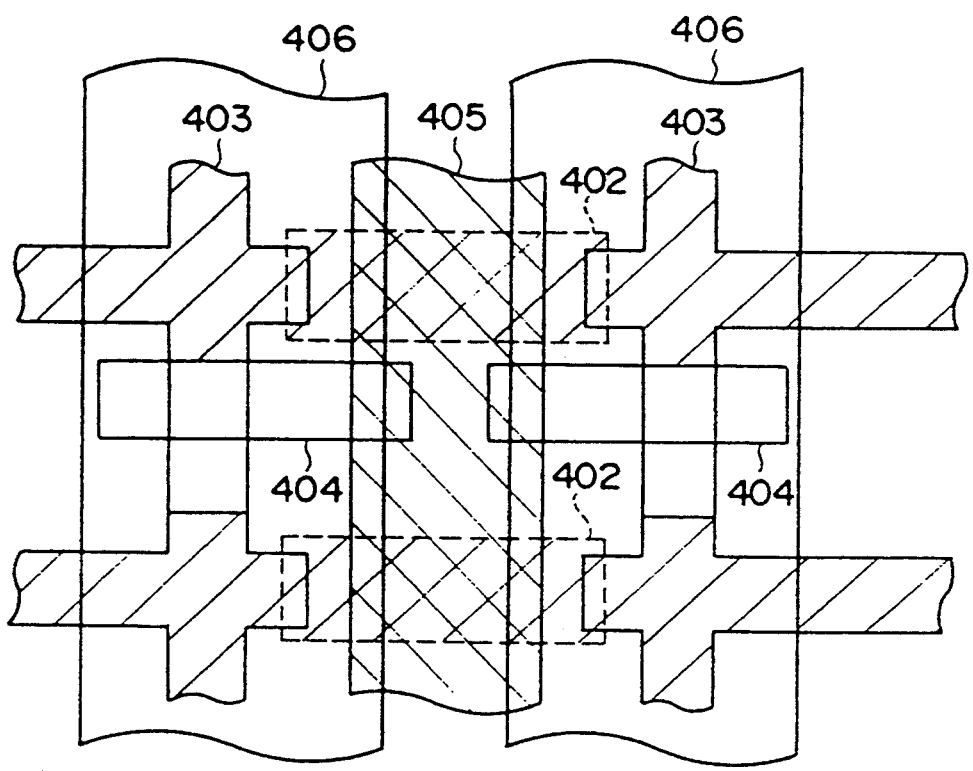

FIG. 9 is a plan view showing the pattern construction of part of a memory cell array in a nonvolatile semiconductor memory device according to a fourth embodiment of this invention and in this pattern construction, the source and drain regions are formed of the common regions as in the third embodiment.

First source-drain common regions 402 of n+-type are formed in the main surface area of a p-type semiconductor substrate 401, for example. The common regions 402 are formed by ion-implanting n-type impurity into regions at which the common regions 402 will be formed to intersect the erasing gate electrodes 405 and thermally diffusing the implanted impurity before the field oxide film is formed in the same manner as in the second embodiment. Second source-drain common regions 403 are formed in the main surface area of the substrate 401. The common regions 403 are formed in the channel width direction (column direction) of the memory cell transistor and in contact with the first source-drain common regions 402. The common regions 403 are formed by ion-implanting n-type impurity and thermally diffusing the implanted impurity before the field oxide film is formed. Floating gate electrodes 404 formed of a first-layered polysilicon layer is formed over the substrate 401 with a first gate oxide film disposed therebetween. Erasing gate electrodes 405 are formed over the resultant structure with a second gate oxide film or a thin oxide film disposed therebetween. Control gate electrodes 406 are formed of a third-layered polysilicon layer are formed over the resultant structure with an insulation film (not shown) having a three-layered structure of oxide film-nitride film-oxide film disposed therebetween.

With the above construction, the field oxide film having a sufficiently large film thickness is disposed in the intersecting portions between the erasing gate electrodes 405 and the first source-drain common regions 402. Therefore, the dielectric breakdown will not occur in the oxide film even if a high potential difference is applied between the erasing gate electrodes 405 and the first source-drain common regions 402 in the operation of erasing the memory data of the memory cell transistor.

The memory device shown in FIG. 9 is manufactured in substantially the same manufacturing process as in the second embodiment. That is, n-type impurity is first selectively ion-implanted only into intersecting portions at which the erasing gate electrodes 405 and the source-drain common regions will be formed to intersect and then thermally diffused to form the first source-drain common regions 402. After this, the field oxide film is formed on an area including the regions 402 so that the first source-drain common regions 402 can be formed under the field oxide film. Therefore, the field oxide film having the sufficiently large film thickness is disposed in the intersecting portions between the first source-drain common regions 402 and the erasing gate electrodes 405. Further, only the first source-drain common regions 402 which are the intersecting portions between the erasing gate electrodes 405 and the source-drain common regions are formed in a position under the field oxide film in the same manner as in the second embodiment, and impurity is ion-implanted and thermally diffused to form the second source-drain common regions 403 after the field oxide film is formed. Therefore, the channel region will receive less influence by the heat treatment effected for forming the field oxide film in comparison with the case of the third embodiment. Therefore, even if the first source-drain common regions 402 formed under the field oxide film are widened, the channel length of the memory cell transistor will not change.

According to a fifth embodiment, after the field oxide film has been formed, the n+-type impurity-diffusion layers are formed only on the source-drain common regions 402 which intersect with the erasing gates 405, then oxide films are formed on these n+-type impurity-diffusion layers, and the second source-drain common regions 403 are formed and connected to the first source-drain common regions 402, in the method explained later in conjunction with a sixth embodiment which will be described below. More precisely, the second source-drain common regions are be formed and connected to the first source-drain common regions as is shown in FIG. 10. The fifth embodiment, having this structural features, also has the advantages identical to those of the fourth embodiment.

A nonvolatile semiconductor memory device according to a sixth embodiment of this invention and a method for manufacturing the same are explained with reference to FIGS. 11, 12A, 12B, 13A to 13E and 14A to 14E. FIG. 11 is a pattern plan view, and FIGS. 12A and 12B are cross sectional views of the pattern taken along the lines F—F' and G—G' of FIG. 11. FIGS. 13A to 13E and FIGS. 14A to 14E are cross sectional views of the patterns taken along the lines F—F'and G—G' of FIG. 1 in a sequence of the manufacturing steps. In order to clarify the explanation, the pattern of one memory cell transistor is shown in FIG. 11.

As shown in FIG. 11, an n+-type impurity region 502' is formed in the row direction in the main surface area of the semiconductor substrate 501. As will be described later, the region 502' is formed by ion-implanting n-type impurity before an oxide film 524 is selectively formed only in the intersecting portion between the erasing gate electrode and the region 502'. An opening 529 is used as a mask in the above ion-plantation step. The n+-type impurity region 502 is formed in the main surface area of the substrate 501. The region 502 is formed by ion-implanting n-type impurity after an oxide film 524 is formed and it is formed in contact with the impurity region 502'. An n+-type drain region 503 is formed separately from the source region 502 in the main surface area of the substrate 501. A floating gate electrode 504 formed of a first-layered polysilicon layer is formed over that portion of the substrate 501 which lies between the source region 502 and the drain region 503 with a first gate oxide film disposed therebetween. An erasing gate electrode 505 formed of a second-layered polysilicon layer is formed in the column direction on a thin oxide film or a second gate oxide film 513 which is formed on the resultant structure. A control gate electrode 506 formed of a third-layered polysilicon layer is formed over that portion of the resultant structure which lies between the source region 502 and the drain region 503 of the resultant structure with an insulation film having a three-layered structure of oxide film-nitride film-oxide film disposed therebetween. For example, a data line 507 formed of aluminum is formed in the row direction on an oxide film 515 which is formed on the resultant structure and acts as an interlayer insulation film shown in FIG. 12. The data line 507 is connected to the drain region 503 of the memory cell via a contact hole 508 and is also connected to a sense amplifier (not shown).

The pattern shown in FIG. 11 has the cross sections as shown in FIGS. 12A and 12B. As shown in FIG. 12A, the n+-type source region 502 and the n+-type impurity region 502' are formed in the surface area of the semiconductor substrate 501 and the regions 502 and 502' are combined to act as a source region. The erasing gate electrode 505 is formed on the oxide film 524 which is formed on the region 502'. The interlayer insulation film 515 is formed on the resultant structure and the data line 507 is formed on the interlayer insulation film 515.

As shown in FIG. 12B, the n+-type impurity region 502' is formed in the main surface area of the semiconductor substrate 501. The oxide film 524 is formed on the region 502' and a field oxide film 511 acting as an element isolation region is formed on the other region. The first gate oxide film, the floating gate electrode 504, the thin oxide film or second gate oxide film 513 and the erasing gate electrode 505 are sequentially formed on the field oxide film 511. Further, the insulation film 514 having the three-layered structure of oxide film-nitride film-oxide film and the control gate electrode 506 are sequentially formed on the erasing gate electrode 505. The interlayer insulation film 515 is formed on the resultant structure.

With the above construction, the oxide film 524 having a sufficiently large film thickness is disposed in the intersecting portion (region 502') between the erasing gate electrode 505 and the source region. Therefore, the dielectric breakdown will not occur in the interlayer oxide film 524 even if a high potential difference is applied between the erasing gate electrode and the source region in the operation of erasing the memory data of the memory cell.

Next, a method for manufacturing the nonvolatile semiconductor memory device shown in FIGS. 11, 12A and 12B is explained with reference to FIGS. 13A to 13E and 14A to 14E.

As shown in FIGS. 13A and 14A, the field oxide film 511 is formed to a thickness of approximately 8000 Å in the main surface area of the p-type semiconductor substrate 501 by the selective oxidation method, for example.

Next, as shown in FIGS. 13B and 14B, the oxide film 525 is formed to a thickness of approximately 500 Å by the thermal oxidation method. A nitride film 526 which is used as an oxidation-resistant film is formed to a thickness of approximately 1000 Å on the oxide film 525 by the CVD method.

Then, photoresist 527 is coated on the resultant structure and a portion of the photoresist 527 which lies on an intersecting region at which the erasing gate will be formed to intersect the source region is removed by the photolithographic method to form the opening 529. After this, the nitride film 526 and oxide film 525 are sequentially removed to expose part of the surface of the substrate 501 with the remaining photoresist 527 used as a mask. Further, n-type impurity is ion-implanted into the substrate 501 with the photoresist 527 used as a mask so as to form the semiconductor structure as shown in FIGS. 13C and 14C. At the time of ion-implantation, the opening 529 is wider than the space defined by the end portion of the field oxide film 511, as is shown in FIG. 14. Nontheless, the impurity will not be doped into that portion of the substrate 501 on which the field oxide film 511 is formed.

After the photoresist 527 is removed, the oxide film 524 is formed by the thermal oxidation method in the opening in which the surface of the substrate 501 is exposed or in the intersecting portion at which the erasing gate electrode will be formed to intersect the source region. The oxide film 524 is formed to a thickness of approximately 2000 Å so as to completely withstand a high potential difference applied between the erasing gate electrode and the source region in the operation of erasing memory data of the memory cell. At this time, since the nitride film 526 which is an oxidation-resistant film is left in a region other than the opening 529, the oxide film 524 will not be grown. Therefore, as shown in FIGS. 13D and 14D, the oxidation film 524 can be selectively formed only on that portion of the semiconductor substrate 501 which lies in the intersecting portion.

Next, as shown in FIGS. 13E and 14E, the nitride film 526 and the oxide film 525 are removed. Then, the first gate oxide film 512 is formed to a thickness of approximately 300 Å on the resultant structure by the thermal oxidation method. A first polysilicon layer is formed on the oxide film 512 by use of the CVD method. Photoresist (not shown) is coated on the polysilicon layer and that portion of the photoresist which does not correspond to the formation area of the floating gate electrode 504 is selectively removed by use of the photolithographic method. After this, the polysilicon layer is patterned with the remaining photoresist used as a mask to form the floating gate electrode 504. Then, the heat treatment is effected again to form the second gate oxide film 513. The second gate oxide film 513 is used as a tunnel oxide film for permitting a tunnel current to flow between the floating gate electrode 504 and the erasing gate electrode 505 in the operation of erasing memory data. The film thickness of the oxide film 513 may be set to an optimum value according to a voltage applied to the erasing gate electrode 505. Next, a second polysilicon layer is formed on the resultant structure by the CVD method and patterned to form the erasing gate electrode 505. As a result, as shown in FIGS. 13E and 14E, the oxide film 524 is formed to a film thickness of approximately 2000 Å in the intersecting portion between the erasing gate electrode 505 and the impurity region 502' acting as the source region. Therefore, in the operation of erasing memory data, the dielectric breakdown will not occur in the oxide film even if a high potential difference is applied between the erasing gate electrode and the source region. After this, a mask is formed by use of photoresist, and n-type impurity is selectively ion-implanted only into the drain region by using the mask and is then diffused to form the drain region 503. Next, the insulation film 514 having the three-layered structure is formed by sequentially forming an oxide film, nitride film and oxide film (not shown) on the resultant structure. A third-layered polysilicon layer is formed on the insulation film 514 and patterned by use of the photolithographic method to form the control gate electrode 506, and then the interlayer insulation film 515 is formed on the resultant structure by the CVD method. The contact hole 508 is formed in that portion of the interlayer insulation film 515 which lies on the drain region 503 and another contact hole (not shown) is formed on that portion of the interlayer insulation film 515 which lies on the source region 502. Then, an aluminum layer is formed on the interlayer insulation film 515 by the sputtering method, for example, and patterned to form the data line 507 and the source ground line. The data line 507 is connected to the drain region 503 via the contact hole 508 and the source ground line is connected to the source region via the other contact hole.

With the above construction and the manufacturing method, the oxide film 524 having a sufficiently large film thickness is formed in the intersecting portion (region 502′) between the source region 502 and the erasing gate electrode 505. Therefore, in the operation of erasing memory data, the dielectric breakdown will not occur in the oxide film even if a high potential difference is applied between the erasing gate electrode 505 and the source region 502. Further, the above manufacturing method is different from a method in which a thick oxide film is formed and patterned by the etching process so as to be left behind in the intersecting portion. That is, with the above manufacturing method, the sufficiently thick oxide film 524 is formed by the selective oxidation method in the intersecting portion. Therefore, various problems caused by etching the field oxide film 511 can be prevented.

In the first to fourth embodiments, impurity are ion-implanted before the field oxide film is formed so as to bury the source region in the intersecting portion under the field oxide film. Therefore, the buried source region is influenced by the heat treatment effected for forming the field oxide film and widened or diffused in a vertical direction (depth direction) and lateral direction (direction along the plane). Further, the impurity in the source region is moved into the field oxide film so that the sheet resistance thereof may increase. In contrast, according to the fifth and sixth embodiments, the oxide film 524 in the intersecting portion is formed separately from the field oxide film 511 for element isolation so that the film thickness thereof can be set to a desired value (under a condition that a sufficiently high dielectric breakdown voltage is obtained and influence on the impurity region is suppressed to a minimum). In the above example, the thickness of the field oxide film 511 is set at approximately 8000 Å and the thickness of the oxide film 524 is set at approximately 2000 Å. Therefore, the impurity region 502′ will receive less influence by heat than in the case wherein it is formed under the field oxide film 511. As a result, the diffusion of the impurity region 502′ in the vertical and lateral directions can be suppressed and the sheet resistance thereof can be lowered.

FIGS. 15A and 15B are pattern plan views showing the intersecting portions between the erasing gate electrode and the source region (or impurity region acting as the source region). FIG. 15A corresponds to the first to fourth embodiments and FIG. 15B corresponds to the fifth and sixth embodiments.

As shown in FIG. 15A, in the case of the manufacturing method for the first to fourth embodiments, an actually formed source region (impurity region) 602 is larger than an opening 601 formed in a mask for permitting impurity to be selectively ion-implanted into the intersecting portion. This is because the region 602 is influenced by heat generated in the step of forming the field oxide film and is widened by a distance xjL1. When the mask is deviated or shifted in the channel length direction, the region 602 is shifted by a corresponding distance. For this reason, it becomes necessary to take the mask alignment tolerance due to the mask misalignment into consideration. The remaining source regions 603 are formed by ion-implantation after the field oxide film is formed. The case in which the source region in the channel width direction is formed in two steps as shown in FIG. 15A is explained in the second and fourth embodiments. However, the same problem occurs in the case wherein it is formed in one step as in the first and third embodiments.

The problem can be solved by setting the size in the channel length direction of the pattern of the field oxide film at the time of formation smaller than that of the opening 604 as in the case of the fifth and sixth embodiments as shown in FIG. 15B. That is, the opening 604 is formed in the oxide film in the intersecting portion between the erasing gate electrode and the source region, and the source region 605 is formed by ion-implanting impurity via the opening 604. At the time of forming the source region 605, the size in the channel length direction of the opening 604 is defined by the field oxide film so that the size in the channel length direction of the source region 605 can be made smaller than that of the opening 604. The remaining source region 606 is formed by ion-implantation after the field oxide film is formed. In this way, when the impurity is ion-implanted, the source region 605 can be formed in a self-alignment manner since the size in the channel length direction thereof is defined by the field oxide film and the size in the channel width direction thereof will not influence the characteristic of the memory cell transistor if it is formed in contact with the source region 606 and it is not necessary to pay any attention to the mask misalignment. Further, the oxide film selectively formed on the source region 605 is formed in a step different from the field oxide film forming step so that the film thickness of the oxide film can be set so as to withstand a high potential difference and receive less influence by heat. Therefore, the influence on the source region by heat can be reduced and the diffusion in the channel length direction can be reduced as shown by xjL2 in FIG. 15B. As a result, the sheet resistance can be reduced.

The sixth embodiment can be applied to the nonvolatile semiconductor memory device as described in the first to fifth embodiments.

What is claimed is:

1. A method for manufacturing a non-volatile semiconductor memory device, the method comprising the steps of:

forming a field insulating film to define element regions on a major surface of a semiconductor material of a first conductivity type;

forming an oxidation-resistant film on the resulting structure;

forming openings through said oxidation-resistant film to expose portions of said major surface;

implanting impurities of a second conductivity type into said semiconductor material through said openings to form impurity doped regions;

performing thermal oxidation, using said oxidation-resistant film as a mask, to form a first insulating film on said exposed portions of said major surface of said semiconductor material, said first insulating film having a thickness less than a thickness of said field insulating film;

removing said oxidation-resistant film;

forming a gate insulating film on channel regions of said element regions;

forming a first conductive layer on said gate insulating film;

patterning said first conductive layer to form floating gate electrodes which are electrically isolated from said channels regions by said gate insulating film;

forming a second insulating film on the resulting structure;

forming a second conductive layer on said second insulating film;

patterning said second conductive layer to form elongated parallel erasing gate electrodes which are insulated from said floating gates by said second insulating film, and which cross over said impurity doped regions with said first insulating film disposed therebetween;

forming a third insulating film on the resulting structure;

forming a third conductive layer on said third insulating film; and patterning said third conductive layer for form control gate electrodes, and wherein source and drain regions are formed by implanting impurities of the second conductivity type into said element regions such that said impurity doped regions contact either said source regions or said drain regions to form respective elongated parallel impurity regions in said major surface.

2. The method according to claim 1, wherein the steps of forming said first, second, and third conductive layers each comprise forming a polysilicon layer by chemical vapor deposition (CVD).

3. The method according to claim 1, wherein said first insulating film has a thickness greater than thicknesses of said gate insulating film, said second insulating film, and said third insulating film.

4. The method according to claim 3, wherein said first insulating film has a thickness of approximately 2000 Angstroms.

* * * * *